(12) United States Patent
Kim et al.

(10) Patent No.: US 7,524,761 B2
(45) Date of Patent: Apr. 28, 2009

(54) METHOD FOR MANUFACTURING SEMICONDUCTOR DEVICE CAPABLE OF REDUCING PARASITIC BIT LINE CAPACITANCE

(75) Inventors: Soo Hyun Kim, Seoul (KR); Baek Mann Kim, Kyoungki-do (KR); Young Jin Lee, Kyoungki-do (KR); Sun Woo Hwang, Kyoungki-do (KR); Dong Ha Jung, Kyoungki-do (KR); Jeong Tae Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 151 days.

(21) Appl. No.: 11/776,905

(22) Filed: Jul. 12, 2007

(65) Prior Publication Data

US 2008/0146026 A1      Jun. 19, 2008

(30) Foreign Application Priority Data

Dec. 14, 2006   (KR) .................. 10-2006-0128129

(51) Int. Cl.
*H01L 21/00* (2006.01)
(52) U.S. Cl. .................. 438/653; 438/680; 438/586
(58) Field of Classification Search .................. 438/653, 438/680, 685
See application file for complete search history.

(56) References Cited

U.S. PATENT DOCUMENTS

| | | | | |
|---|---|---|---|---|
| 5,691,235 A | * | 11/1997 | Meikle et al. | 438/680 |
| 5,861,675 A | * | 1/1999 | Sasaki et al. | 257/764 |
| 6,429,086 B1 | * | 8/2002 | Meikle et al. | 438/381 |
| 6,472,323 B1 | * | 10/2002 | Meikle et al. | 438/685 |
| 6,730,954 B2 | * | 5/2004 | Meikle et al. | 257/306 |
| 2005/0042829 A1 | * | 2/2005 | Kim et al. | 438/268 |
| 2007/0080459 A1 | * | 4/2007 | Seok | 257/751 |
| 2008/0057688 A1 | * | 3/2008 | Jeong et al. | 438/586 |

FOREIGN PATENT DOCUMENTS

| | | | |
|---|---|---|---|
| KR | 2001-0065288 A | | 11/2001 |
| KR | 2006-0076584 A | | 4/2006 |

* cited by examiner

*Primary Examiner*—Laura M Menz
(74) *Attorney, Agent, or Firm*—Ladas & Parry LLP

(57) ABSTRACT

A semiconductor memory device is manufactured by: forming a hole by etching an interlayer insulation film formed over a semiconductor substrate; forming a barrier film over the interlayer insulation film including a surface of the hole; forming a first metal film over the barrier film so as to fill in the hole; forming a bit line contact plug in the hole by removing the first metal film and the barrier film so as to expose the interlayer insulation film; carrying out a gas treatment to a surface of the interlayer insulation film including the bit line contact plug so as to promote a growth of metal nucleation; forming a second metal film over the gas treated interlayer insulation film; and forming a bit line in contact with the bit line contact plug by etching the second metal film.

18 Claims, 4 Drawing Sheets

METHOD FOR MANUFACTURING SEMICONDUCTOR DEVICE CAPABLE OF REDUCING PARASITIC BIT LINE CAPACITANCE

CROSS-REFERENCE TO RELATED APPLICATIONS

The present application claims priority to Korean patent application number 10-2006-0128129 filed on Dec. 14, 2006, which is incorporated herein by reference in its entirety.

BACKGROUND OF THE INVENTION

The present invention relates to a method for manufacturing a semiconductor device, and more particularly, to a method for manufacturing a semiconductor device, which is capable of reducing a parasitic bit line capacitance due to an increase in a thickness of a barrier film of a bit line.

Bit lines in a semiconductor memory device such as a dynamic RAM (DRAM) supply current through a channel for storing electric charge in the memory capacitors and transfer differing amounts of electric charges between capacitors to a sense amplifier so that the electric charges stored in the capacitors can be converted into data. Typically, the bit lines were formed using a Ti/TiN barrier film and a tungsten conductive film.

Hereinafter, a method for forming the conventional bit line contact plug and the bit line using the tungsten film as a bit line material will be briefly described.

After an interlayer insulation film is formed over upper portion of a semiconductor substrate formed with a desired base structure, the interlayer insulation film is etched to form a hole for a bit line contact plug. Ti/TiN film is formed as a barrier film over the interlayer insulation film including the surface of the hole. A tungsten film is formed as a conductive film over the barrier film to fill the hole. A hard mask made of a nitride film defining a bit line forming area is formed on the tungsten film.

The conductive film and the barrier film are etched using the hard mask as an etching mask to form a bit line contact plug in the hole and also to form a bit line over the interlayer insulation film such that the bit line is in contact with the bit line contact plug.

The conductive film serves to transfer most of the electric flows when the semiconductor is operating, and the barrier film serves to improve the contact resistance and protects the junction area by inhibiting chemical reaction between the tungsten film and any of the base structure during the deposition of the tungsten film.

However, the thickness ratio of the barrier film and the conductive film has reached to almost 1:1 when fabricating a highly integrated semiconductor device, causing various problems.

A conventional bit line structure in a semiconductor device, for example, has a bit line contact plug and a bit line 130 including a barrier film and a conductive film respectively, and the thickness for each of the barrier film and the conductive film is almost same.

When the thickness for each of the barrier film and the conductive film is almost same, the subsequent photo and etching processes are difficult to carry out, and the parasitic capacitance of the semiconductor increases, thereby degrading the device properties and lowering the production yield.

BRIEF SUMMARY OF THE INVENTION

Embodiments of the present invention are directed to a method for manufacturing a semiconductor device capable of minimizing a thickness of a barrier film of a bit line.

Further, embodiments of the present invention are directed to a method for manufacturing a semiconductor device capable of minimizing a thickness of a barrier film of a bit line and thereby reducing a parasitic bit line capacitance.

Also, embodiments of the present invention are directed to a method for manufacturing a semiconductor device capable of reducing a parasitic bit line capacitance thereby improving a device properties and a production yield.

In one embodiment, a method for manufacturing a semiconductor device may comprise forming a hole by etching an interlayer insulation film formed over a semiconductor substrate; forming a barrier film over the interlayer insulation film including a surface of the hole; forming a first metal film over the barrier film so as to fill in the hole; forming a bit line contact plug in the hole by removing the first metal film and the barrier film so as to expose the interlayer insulation film; carrying out a gas treatment to a surface of the interlayer insulation film including the bit line contact plug so as to promote a growth of metal nucleation; forming a second metal film over the gas treated interlayer insulation film; and forming a bit line in contact with the bit line contact plug by etching the second metal film.

The barrier film is formed of Ti/TiN film or W/WN film.

The W/WN film is formed in such a manner that, after W is deposited using $WF_6$ as a source gas and one of $SiH_4$, $Si_2H_6$, $B_2H_6$, $BH_3$, $B_4H_{10}$, $B(CH_3)_3$ and $H_2$ as a reaction gas, one of NH3 gas, N2H4 gas and N2 gas is added to the reaction gas in situ to deposit WN.

The W/WN film is formed at a temperature of 200 to 450° C. and a pressure of 1 to 50 Torr.

The first and second metal films are formed of a first and second tungsten films or a first and second copper films.

The first and second tungsten films are formed by CVD using $WF_6$ as a source gas and one of $SiH_4$, $Si_2H_6$, $B_2H_6$, $BH_3$, $B_4H_{10}$, $B(CH_3)_3$ and $H_2$ as a reaction gas.

The first and second tungsten films are formed at a temperature of 200 to 450° C. and a pressure of 1 to 50 Torr.

The second tungsten film is formed using 50 to 200 sccm of $WF_6$ gas and 2000 to 8000 sccm of $H_2$ gas.

The second tungsten film is formed in such a manner that while the second tungsten film is deposited using 50 to 200 sccm of $WF_6$ gas and 2000 to 8000 sccm of $H_2$ gas, 50 to 500 sccm of $SiH_4$ gas is further added to deposit the second tungsten film.

The second tungsten film is formed in such a manner that while the second tungsten film is deposited using $WF_6$ gas and $SiH_4$ gas, $H_2$ gas is further added to deposit the second tungsten film.

The second tungsten film formed using $WF_6$ gas and $SiH_4$ gas is deposited to a thickness of 5 to 10 nm.

The remove of the first metal film and the barrier film for exposing the interlayer insulation film is carried out by a CMP or an etch back process.

The gas treatment to the surface of the interlayer insulation film including the bit line contact plug is carried out using one of $B_2H_6$, $SiH_4$, $Si_2H_6$, $B_4H_{10}$, and $B(CH_3)_3$.

The gas treatment to the surface of the interlayer insulation film including the bit line contact plug is carried out by supplying $B_2H_6$ gas at a flow rate of 200 to 2000 sccm for 5 to 200 seconds.

The $B_2H_6$ gas is supplied in plasma phase.

The supply of the $B_2H_6$ gas is carried out in a manner of forming directly the $B_2H_6$ plasma in a processing chamber to supply, or a remote manner of forming the $B_2H_6$ plasma in a separate plasma chamber to supply to a processing chamber.

The $B_2H_6$ plasma is formed by supplying Ar and $H_2$ gases together into the chamber.

A total flow rate of the Ar and $H_2$ gases is preferably 200 to 2000 sccm.

DESCRIPTION OF SPECIFIC EMBODIMENTS

A preferred embodiment of the present invention is directed to a method for manufacturing a semiconductor device, in which a bit line contact plug is formed with a barrier film and a conductive film, and a bit line which is in contact with the bit line contact plug is formed with only a conductive film without a barrier film.

The barrier film formed in the bit line contact plug serves to improve the contact resistance and to inhibit any harmful chemical reaction between the base structure (such as a transistor) and the conductive film for the bit line, and therefore it is possible to ensure the device properties. In addition, since the bit line is formed with only a conductive film without a barrier film, and this does not present difficulties in the following processes and does not increase the parasitic bit line capacitance. Thus, the device properties and the production yield are improved when semiconductor memory devices are manufactured in accordance with an embodiment of the present invention as detailed below.

Hereafter, a method for manufacturing a semiconductor device in accordance with an embodiment of the present invention will be described with reference to the attached drawings.

FIGS. 1A-1G are cross-sectional views illustrating the process steps of a method for manufacturing a semiconductor device in accordance with an embodiment of the present invention.

Figure 1A:
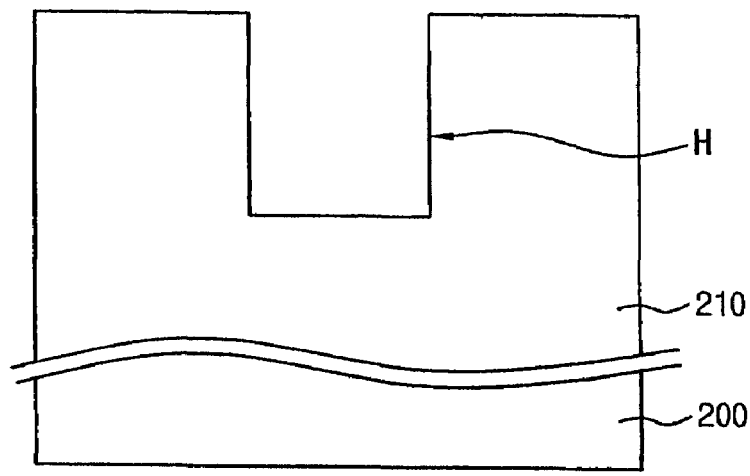
FIGS. 1A-1G are cross-sectional views illustrating the process steps of a method for manufacturing a semiconductor device in accordance with an embodiment of the present invention.

Referring to FIG. 1A, an interlayer insulation film 210 is formed over an upper portion of a semiconductor substrate 200 formed with a certain base structure such as transistors (not shown) so as to cover the base structure. The interlayer insulation film 210 is etched to form a hole H for forming a bit line contact plug.

Figure 1B:
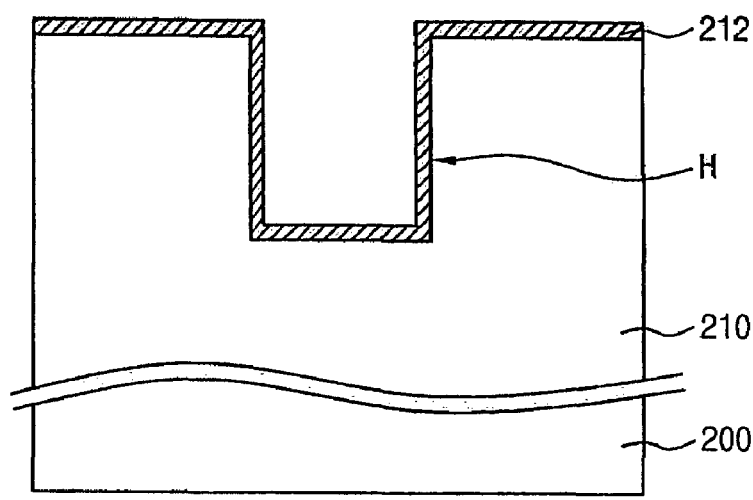

Referring to FIG. 1B, a barrier film 212 is formed over the interlayer insulation film 210 including a surface of the hole H. The barrier film is formed of a Ti/TiN film or a W/WN film. When the barrier film 212 is formed of the W/WN film, the W/WN film is formed by using $WF_6$ as a source gas and one gas and one of $SiH_4$, $Si_6$, $B_6$, $BH_3$, $B_4H_{10}$, $B(CH_3)_3$, and $H_2$ as a reaction gas in such a manner that after W is deposited at a temperature of 200 to 450□ at a pressure of 1 to 50 Torr, one of NH3 gas, N4 gas, and N2 gas is added in situ to deposit WN.

Figure 1C:
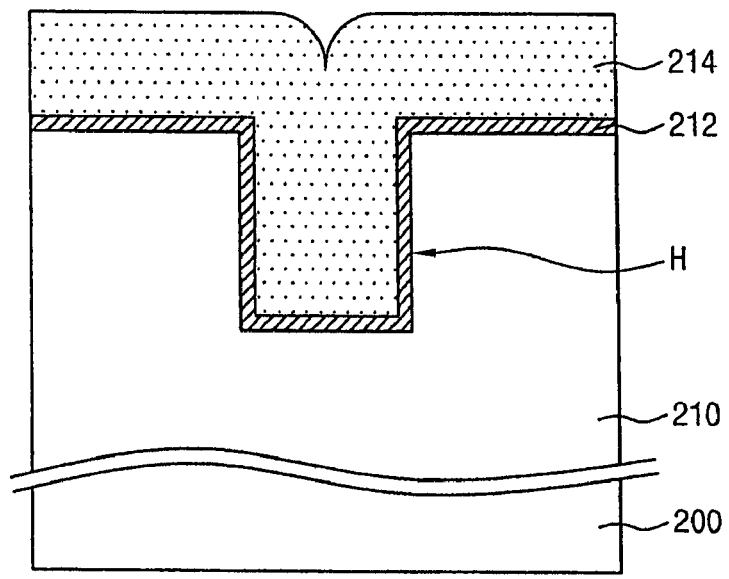

Referring to FIG. 1C, a first tungsten film 214 is deposited as a conductive film over the barrier film 212 and to fill the hole H. It is also possible to form a first conductive film 214 with copper or the like material, instead of the first tungsten film 214. The first tungsten film 214 is formed by a chemical vapor deposition (CVD) process using $WF_6$ as a source gas and one of $SiH_4$, $Si_6$, $B_6$, $BH_3$, $B_4H_{10}$, $B(CH_3)_3$, and $H_2$ as a reaction gas at a temperature of 200 to 450□ and a pressure of 1 to 50 Torr.

Figure 1D:
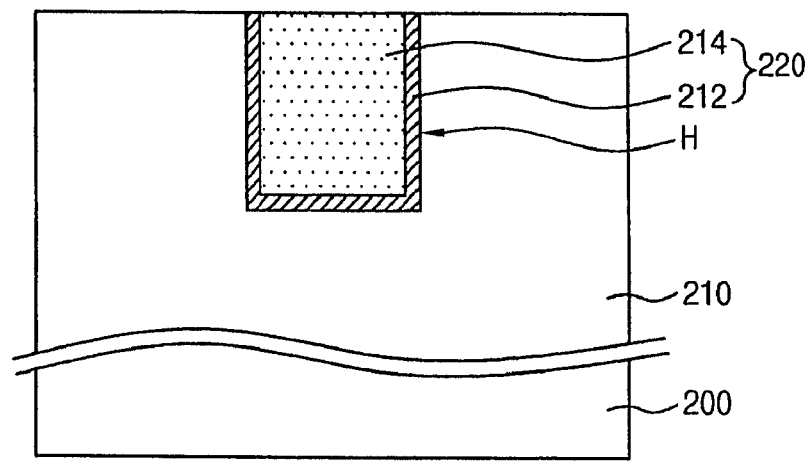

Referring to FIG. 1D, parts of the first tungsten film 214 and the barrier film 212 formed over the interlayer insulation film 210 are removed to form a bit line contact plug 220 in the hole H. The removal of the first tungsten film 214 and the barrier film 212 formed over the interlayer insulation film 210 is carried out by a chemical mechanical polishing (CMP) process or an etch back process.

Figure 1E:
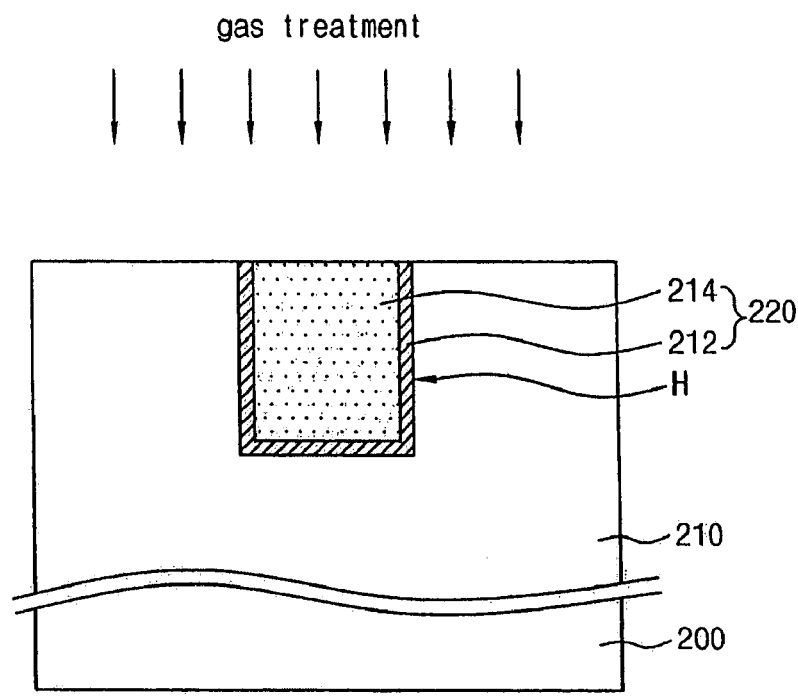

Referring to FIG. 1E, the surface of the interlayer insulation film 210 having the bit line contact plug 220 formed thereon is treated using one of $B_6$, $SiH_4$, $Si_6$, $B_4H_{10}$, and $B(CH_3)_3$ so as to promote a growth of metal nucleation.

For example, the gas treatment to the surface of the interlayer insulation film 210 is carried out using $B_2H_6$ gas, and the $B_2H_6$ gas is supplied at a flow rate of 200 to 2000 sccm for 5 to 200 seconds. At this time, the $B_2H_6$ gas is supplied in the plasma phase, either by forming the $B_2H_6$ plasma directly in the processing chamber or by forming the $B_2H_6$ plasma in a separate plasma chamber in a remote manner and supplying the plasma to the processing chamber. Also, the $B_2H_6$ plasma is formed by supplying the Ar and $H_2$ gases together into the chamber, and a total flow rate of the Ar and $H_2$ gases is preferably at a rate of 200 to 2000 sccm.

Figure 1F:
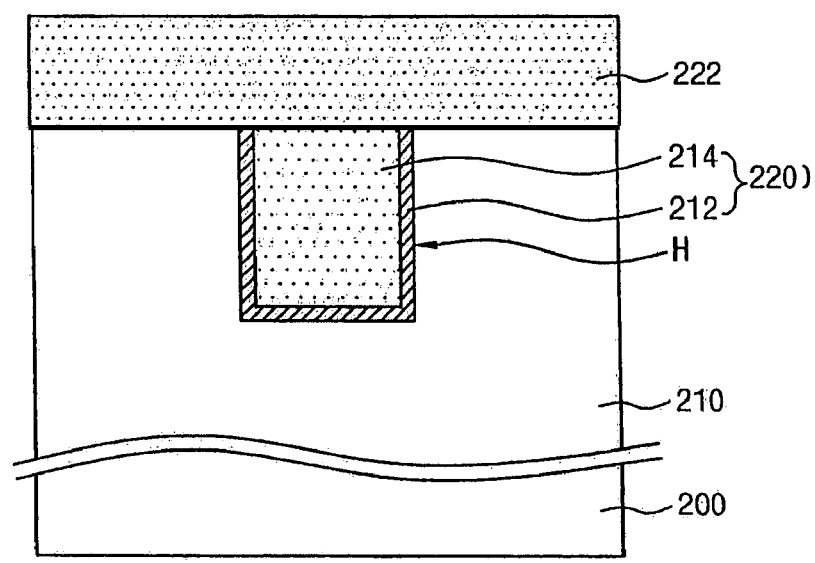

Referring to FIG. 1F, a second tungsten film 224 is deposited as a conductive film over the gas treated interlayer insulation film 210. It may be possible to form a second conductive film 224 with copper or the like material, instead of the second tungsten film 224. The second tungsten film 224 is formed utilizing a CVD process using $WF_6$ as a source gas and one of $SiH_4$, $Si_6$, $B_6$, $BH_3$, $B_4H_{10}$, $B(CH_3)_3$, and $H_2$ as a reaction gas at a temperature of 200 to 450□ and a pressure of 1 to 50 Torr.

For example, the second tungsten film 224 is formed using $WF_6$ as the source gas at a flow rate of 50 to 200 sccm and $H_2$ as the reaction gas at a flow rate of 2000 to 8000 sccm, and it may be possible to further add $SiH_4$ gas at a rate of 50 to 500 sccm to the reaction gas to form the second tungsten film 224.

In addition, the second tungsten film 224 may be formed in such a manner that a tungsten film having a thickness of 5 to 10 nm is first deposited using $WF_6$ as a source gas and $SiH_4$ as a reaction gas, and then $H_2$ is further added to the reaction gas to deposit the remaining thickness of the tungsten film.

Figure 1G:
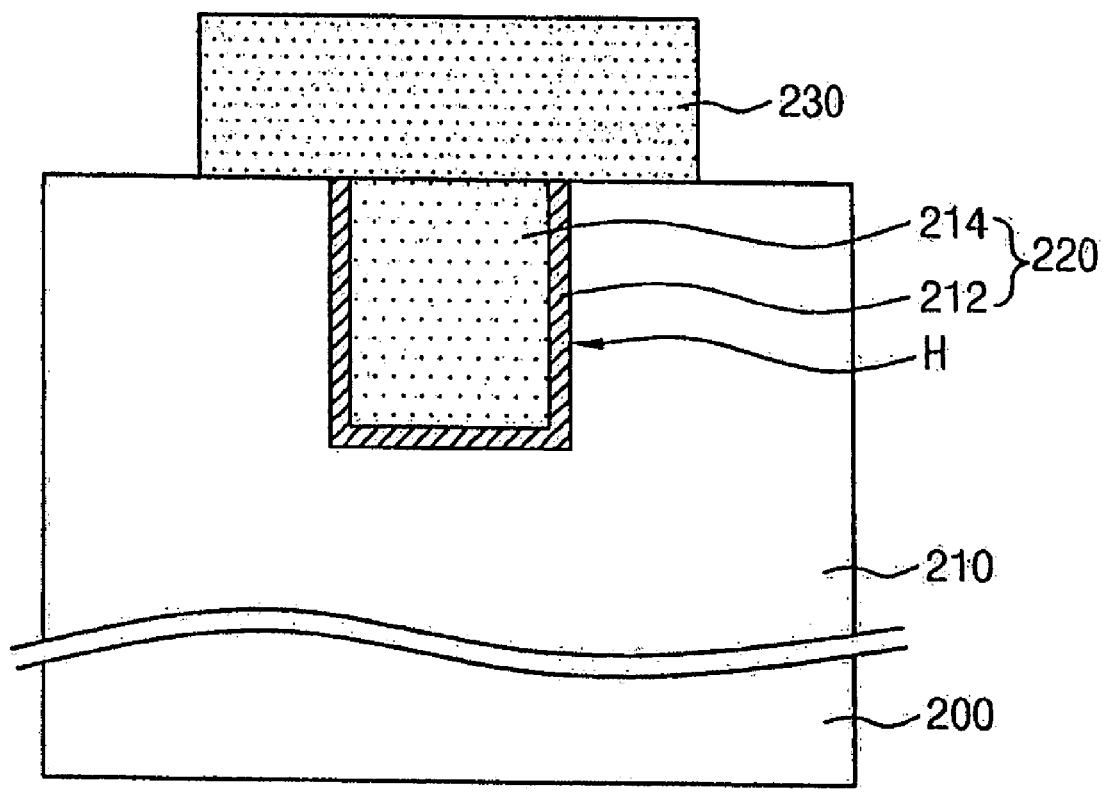

Referring to FIG. 1G, a hard mask (not shown) made of a nitride film and defining a bit line forming area is formed over the second tungsten film. The second tungsten film is etched using the hard mask as an etching mask to form to form a bit line 230, which is in contact with the bit line contact plug 220 and is formed with only a tungsten film without a barrier film 212.

After that, a series of known follow up processes can be performed to fabricate the semiconductor device according to an embodiment of the present invention.

The bit line structure according to an embodiment of the present invention includes the bit line contact plug 220 with the barrier film 212 and the conductive film 214 and the bit line 230 with only the conductive film without a barrier film.

As is apparent from the above description, in an embodiment of the present invention, since the bit line which is in contact with the bit line contact plug is formed with only a conductive film without a barrier film, the thickness of the bit line can be significantly reduced compared to the conventional semiconductor device. Therefore, it is possible to prevent the follow up process from becoming difficult. Also, it is possible to prevent the parasitic bit line capacitance from being increased, thereby capable of improving device properties and a production yield.

Also, in an embodiment of the present invention, because a conductive film of the bit line contact plug and a conductive film of the bit line are formed in the same equipment, utilization of an equipment is increased, thereby capable of reducing manufacturing cost.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
   forming a hole by etching an interlayer insulation film formed over a semiconductor substrate;
   forming a barrier film over the interlayer insulation film including a surface of the hole;
   forming a first metal film over the barrier film so as to fill the hole;
   forming a bit line contact plug in the hole by removing the first metal film and the barrier film so as to expose the interlayer insulation film;
   carrying out a gas treatment to a surface of the interlayer insulation film including the bit line contact plug so as to promote a growth of metal nucleation;
   forming a second metal film over the gas treated interlayer insulation film; and
   forming a bit line in contact with the bit line contact plug by etching the second metal film.

2. The method for manufacturing a semiconductor device according to claim 1, wherein the barrier film is formed of Ti/TiN film or W/WN film.

3. The method for manufacturing a semiconductor device according to claim 2, wherein the W/WN film is formed by depositing W using $WF_6$ as a source gas and one of $SiH_4$, $Si_2H_6$, $B_2H_6$, $BH_3$, $B_4H_{10}$, $B(CH_3)_3$ and $H_2$ as a reaction gas and then adding one of NH3 gas, N2H4 gas, and N2 gas to the reaction gas in situ to deposit WN.

4. The method for manufacturing a semiconductor device according to claim 3, wherein the W/WN film is formed at a temperature of 200 to 450° C. and a pressure of 1 to 50 Torr.

5. The method for manufacturing a semiconductor device according to claim 1, wherein the first and second metal films are formed of a first and second tungsten films or of a first and second copper films.

6. The method for manufacturing a semiconductor device according to claim 5, wherein the first and second tungsten films are formed by CVD using $WF_6$ as a source gas and one of $SiH_4$, $Si_2H_6$, $B_2H_6$, $BH_3$, $B_4H_{10}$, $B(CH_3)_3$, and $H_2$ as a reaction gas.

7. The method for manufacturing a semiconductor device according to claim 6, wherein the first and second tungsten films are formed at a temperature of 200 to 450° C. and a pressure of 1 to 50 Torr.

8. The method for manufacturing a semiconductor device according to claim 6, wherein the second tungsten film is formed using $WF_6$ gas at a flow rate of 50 to 200 sccm of and $H_2$ gas at a flow rate of 2000 to 8000 sccm.

9. The method for manufacturing a semiconductor device according to claim 7, wherein the second tungsten film is formed by further adding $SiH_4$ gas at a flow rate of 50 to 500 sccm while the second tungsten film is deposited by using $WF_6$ gas at a flow rate of 50 to 200 sccm and $H_2$ gas at a flow rate of 2000 to 8000 sccm.

10. The method for manufacturing a semiconductor device according to claim 6, wherein the second tungsten film is formed by further adding $H_2$ gas while the second tungsten film is deposited using $WF_6$ gas and $SiH_4$ gas, $H_2$ gas.

11. The method for manufacturing a semiconductor device according to claim 10, wherein the second tungsten film formed using $WF_6$ gas and $SiH_4$ gas is deposited to a thickness of 5 to 10 nm.

12. The method for manufacturing a semiconductor device according to claim 1, wherein the removal of the first metal film and the barrier film for exposing the interlayer insulation film is carried out by a CMP or an etch back process.

13. The method for manufacturing a semiconductor device according to claim 1, wherein the gas treatment to the surface of the interlayer insulation film including the bit line contact plug is carried out by using one of $B_2H_6$, $SiH_4$, $Si_2H_6$, $B_4H_{10}$, and $B(CH_3)_3$.

14. The method for manufacturing a semiconductor device according to claim 1, wherein the gas treatment to the surface of the interlayer insulation film including the bit line contact plug is carried out by supplying $B_2H_6$ gas at a flow rate of 200 to 2000 sccm for 5 to 200 seconds.

15. The method for manufacturing a semiconductor device according to claim 14, wherein the $B_2H_6$ gas is supplied in a plasma phase.

16. The method for manufacturing a semiconductor device according to claim 15, wherein the $B_2H_6$ gas in a plasma phase is supplied by forming the $B_2H_6$ plasma directly in a processing chamber or is supplied to a processing chamber from a separate plasma chamber in which the $B_2H_6$ plasma is formed by a remote manner.

17. The method for manufacturing a semiconductor device according to claim 16, wherein the $B_2H_6$ plasma is formed by supplying Ar and $H_2$ gases together into the processing chamber.

18. The method for manufacturing a semiconductor device according to claim 17, wherein a total flow rate of the Ar and $H_2$ gases is 200 to 2000 sccm.

* * * * *